(12) United States Patent
Shu et al.

(10) Patent No.: US 10,199,265 B2
(45) Date of Patent: Feb. 5, 2019

(54) VARIABLE SPACE MANDREL CUT FOR SELF ALIGNED DOUBLE PATTERNING

(71) Applicant: GLOBALFOUNDRIES INC., Grand Cayman (KY)

(72) Inventors: Jiehui Shu, Clifton Park, NY (US); Byoung Youp Kim, Schenectady, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/430,039

(22) Filed: Feb. 10, 2017

(65) Prior Publication Data
US 2018/0233404 A1 Aug. 16, 2018

(51) Int. Cl.
*H01L 21/768* (2006.01)
*H01L 23/522* (2006.01)
*H01L 23/528* (2006.01)
*H01L 23/532* (2006.01)

(52) U.S. Cl.
CPC .. *H01L 21/76825* (2013.01); *H01L 21/76802* (2013.01); *H01L 21/76831* (2013.01); *H01L 23/528* (2013.01); *H01L 23/5226* (2013.01); *H01L 23/5329* (2013.01)

(58) Field of Classification Search
USPC ... 257/622, 66, 72, 223, 227, 291, 292, 439, 257/443, 655, E27.1, E27.125, E27.112, 257/E29.117, E29.145, E29.147, E29.151, 257/E29.182, E29.202, E29.273–E29.299, 257/E29.314, E29.32, E23.016; 438/149
See application file for complete search history.

(56) References Cited

U.S. PATENT DOCUMENTS

| | | | |
|---|---|---|---|
| 9,177,797 B2 | 11/2015 | Chang et al. | |
| 9,299,787 B1 * | 3/2016 | Cheng | H01L 21/31155 |
| 2007/0287255 A1 * | 12/2007 | Doyle | H01L 29/66795 |
| | | | 438/279 |
| 2013/0119474 A1 * | 5/2013 | Schultz | H01L 21/76895 |
| | | | 257/368 |
| 2014/0097499 A1 | 4/2014 | Parekh et al. | |

(Continued)

FOREIGN PATENT DOCUMENTS

| CN | 102224569 | 10/2011 |
|---|---|---|
| TW | 201515116 | 4/2015 |

OTHER PUBLICATIONS

Examination Report for related TW Application No. 106114622 dated Feb. 9, 2018, 9 pages.

(Continued)

*Primary Examiner* — Tram H Nguyen
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to variable space mandrel cut for self-aligned double patterning and methods of manufacture. The method includes: forming a plurality of mandrels on a substrate; forming spacers about the plurality of mandrels and exposed portions of the substrate; removing a portion of at least one of the plurality of mandrels to form an opening; and filling in the opening with material.

16 Claims, 6 Drawing Sheets

(56) References Cited

U.S. PATENT DOCUMENTS

| 2015/0147886 A1* | 5/2015 | Tung | C23G 1/02 |
| | | | 438/696 |
| 2016/0013185 A1* | 1/2016 | Greene | H01L 27/0886 |
| | | | 257/401 |
| 2016/0093720 A1* | 3/2016 | Chudzik | H01L 29/66795 |
| | | | 438/157 |

OTHER PUBLICATIONS

Notice of Allowance for related TW Application No. 106114622 dated Jun. 26, 2018, 4 pages.

* cited by examiner

FIG. 7B

VARIABLE SPACE MANDREL CUT FOR SELF ALIGNED DOUBLE PATTERNING

FIELD OF THE INVENTION

The present disclosure relates to semiconductor structures and, more particularly, to variable space mandrel cut for self-aligned double patterning and methods of manufacture.

BACKGROUND

As semiconductor processes continue to scale downwards, e.g., shrink, the desired spacing between elements (i.e., the pitch) of a device is less than the pitch that can be manufactured using traditional optical masks and photolithography equipment. One approach used to achieve higher resolution in smaller nodes, e.g., 20 nm or smaller devices, is to use multiple pattern lithography. For example, sidewall imaging techniques have been used to scale the spaces and features of a device. For example, in sidewall imaging techniques, dummy lines (e.g., at a minimum available pitch) are first formed, followed by formation of sidewall aligned spacers on the dummy lines. The dummy lines are removed while leaving the spacers, and then the spacers are used as patterning masks to transfer the desired pattern to underlying layers. In this way, line spacing at approximately half the minimum pitch can be achieved.

The use of additional materials (e.g., reverse material layers) for additional lithography patterning and cutting may be performed on the spacers prior to the removal of the dummy lines. This additional patterning/cutting allows for greater variation and/or more complex patterns to be formed in semiconductors for back end of line (BEOL) processes with small pitches. However, traditional techniques for additional patterning/cutting rely on multiple steps, which increases manufacturing cost. Also, many of these techniques can increase the parasitic performance of the device.

SUMMARY

In an aspect of the disclosure, a method comprises: forming a plurality of mandrels on a substrate forming spacers about the plurality of mandrels and exposed portions of the substrate; removing a portion of at least one of the plurality of mandrels to form an opening; and filling in the opening with material.

In an aspect of the disclosure, a method comprises: forming a plurality of mandrels on a substrate; forming spacers on the plurality of mandrels; etching back the spacers to expose a top surface of the plurality of mandrels and portions of the substrate; forming a coating on the exposed surface of the substrate and on the spacers; removing a portion of at least one of the plurality of mandrels to form a cut along a length thereof; and filling the cut with material.

In an aspect of the disclosure, a structure comprises: a plurality of mandrels; spacer material on sidewalls of the plurality of mandrels having a spacer material thereabout; at least one of the plurality of mandrels having a cut along a length thereof; and spacer material filling the cut along the length thereof.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to variable space mandrel cut for self-aligned double patterning and methods of manufacture. More specifically, the present disclosure provides a method of manufacturing variable space at the mandrel to improve design flexibility. Advantageously, by providing the variable space at the mandrel, it is now possible to further reduce parasitic capacitance of the structure.

In embodiments, the methods described herein provide a fabrication process to pattern a variable tip to tip space at the mandrel and fill the cut area (along a length of the mandrel) with a same material as spacer to define the mandrel cut. In embodiments, the mandrel can be, e.g., amorphous silicon (a-Si) with a TiOx spacer. By using the combination of materials and the processes described herein, it is possible to reduce parasitic capacitance of the structure by about an additional 3%.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figures 1, 2:
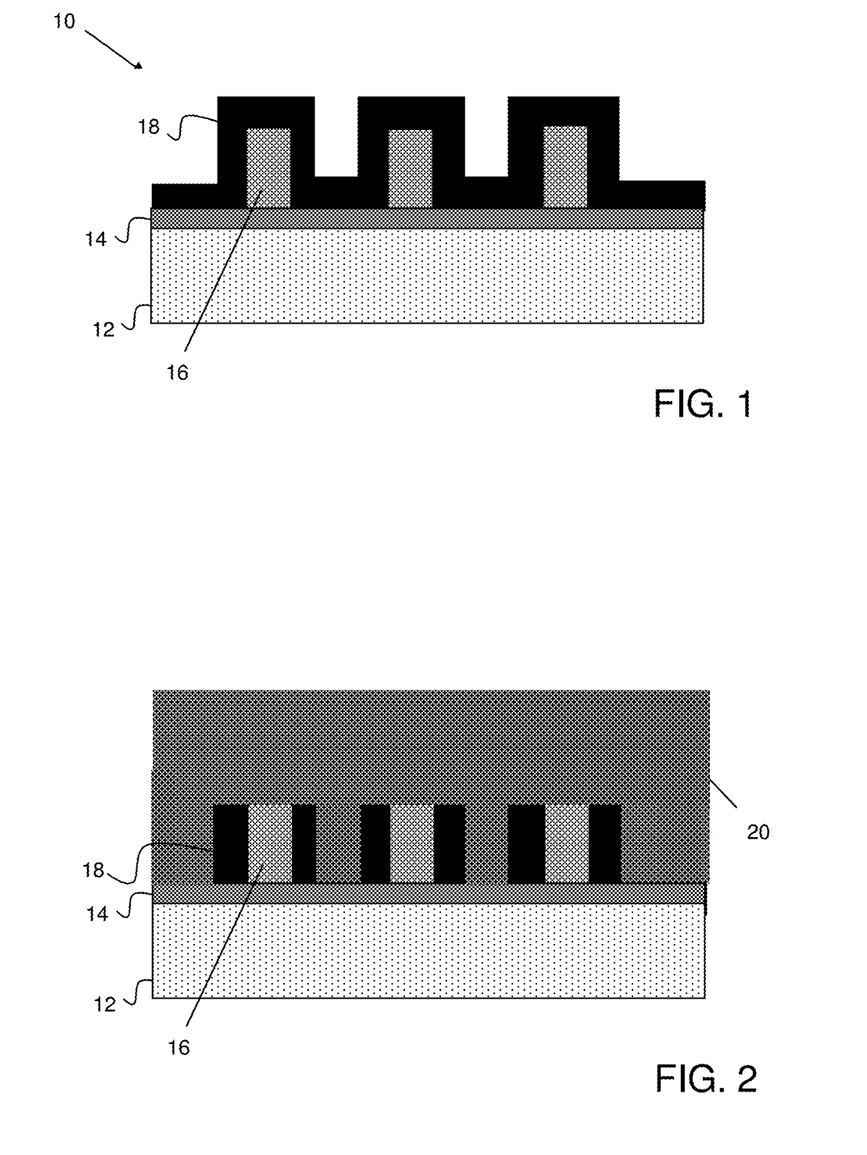
FIG. 1 shows a mandrel with spacers, amongst other features, and respective fabrication processes in accordance with aspects of the disclosure.
FIG. 2 shows a coating applied over spacer material, amongst other features, and respective fabrication processes in accordance with aspects of the disclosure.

FIG. 1 shows a structure and respective fabrication processes in accordance with aspects of the disclosure. In embodiments, the structure 10 includes a back end of the line (BEOL) substrate 14 formed on a substrate 12. In embodiments, the BEOL substrate 14 can be a hardmask such as, e.g., $SiO_2$ or TiN, which can be later removed during conventional variable tip to tip non-mandrel processes of record. The substrate 12 can be dielectric material, e.g., low-k dielectric material, with wiring lines, e.g., copper or other metal lines.

Still referring to FIG. 1, a plurality of mandrels 16 are formed on the BEOL substrate 14. In embodiments, the mandrels 16 can be Si or C based materials; although other materials are also contemplated herein. The mandrels 16 can be formed by conventional deposition processes, e.g., chemical vapor deposition (CVD), followed by lithography and etching processes. For example, after deposition of the material on the BEOL substrate 14, a resist formed over the material is exposed to energy (light) to form a pattern (opening). An etching process with a selective chemistry, e.g., reactive ion etching (RIE), will be used to form one or more spaces in the material through the openings of the resist. The space between adjacent mandrels 16 can be about 3× the thickness of the mandrel 16. The resist can then be removed by a conventional oxygen ashing process or other known stripants.

Following the resist removal, spacer material 18 is formed on the mandrels 16 and exposed portions of the BEOL substrate 14. In embodiments, the spacer material 18 can be, e.g., $TiO_x$, deposited by a conventional deposition process, e.g., CVD or atomic layer deposition (ALD) processes. The spacer material 18 can have a thickness approximately or substantially equal to the thickness of the mandrel 16, hence leaving a space between the spacer material which is approximately the same dimensions of the mandrel 16.

In FIG. 2, the spacer material 18 undergoes an anisotropic etching process to remove material over horizontal surfaces; that is, an anisotropic etching process removes material over the BEOL substrate 14 and a top surface of the mandrels 16. In this way, a surface of the BEOL substrate 14 and a top surface of the mandrels 16 will be exposed for further processing steps. A coating 20 is applied over the spacer material 18, exposed portions of the BEOL substrate 14 and a top surface of the mandrels 16. The coating 20 can be a spin on glass. For example, the coating 20 can be $SiO_2$ or SiOC, deposited using an atomic layer deposition (ALD) process or other spin-on-glass deposition process.

Figure 3A:
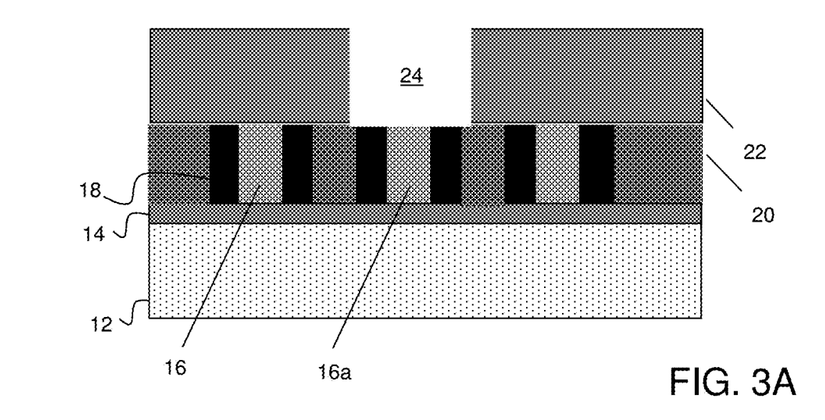
FIG. 3A shows an opening in mask material, amongst other features, and respective fabrication processes in accordance with aspects of the disclosure.
Figure 3B:
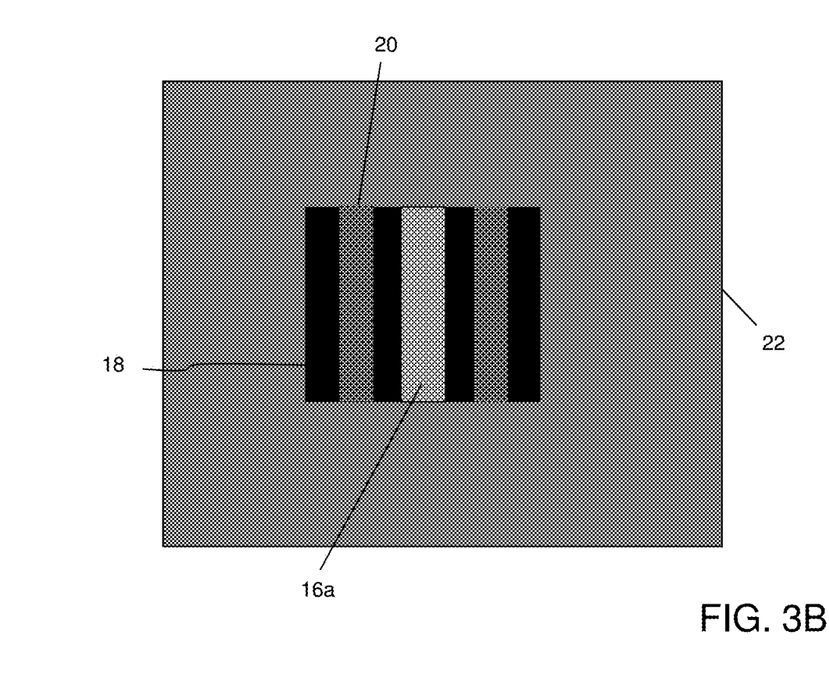
FIG. 3B shows a top view of FIG. 3A.

FIG. 3A shows a cross-sectional view of the structure after further processing; whereas, FIG. 3B shows a top view of FIG. 3A. More specifically, in FIGS. 3A and 3B, the coating 20 undergoes a back etch process, e.g., dry etch process. In embodiments, the back etching will result in the coating 20 being removed above the spacer material 18, exposing the top surface of the mandrels 16. The etching process will result in the coating 20, the top surfaces of the mandrels 16 and spacer material 18 forming a planar surface.

Still referring to FIGS. 3A and 3B, a photolithographic stack of material 22 is formed on the planar surface of the coating 20, top surface of the mandrels 16 and spacer material 18. An opening 24 is formed in the photolithographic stack of material 22 in alignment with mandrel 16a. The photolithographic stack of material 22 can be, e.g., SOH, SiON, ARC material, etc. which is opened using conventional lithographic processes, e.g., exposure to energy. In embodiments, the opening 24 can slightly overlap the coating material 20 adjacent to the spacer material 18. For example, in embodiments, the opening 24 can be, e.g., greater than 2× the width of the spacer material 18. In embodiments, the opening can expose a portion of the spacer material 18 and a portion of the mandrel 16a, which can be later removed to form a cut.

Figure 4A:
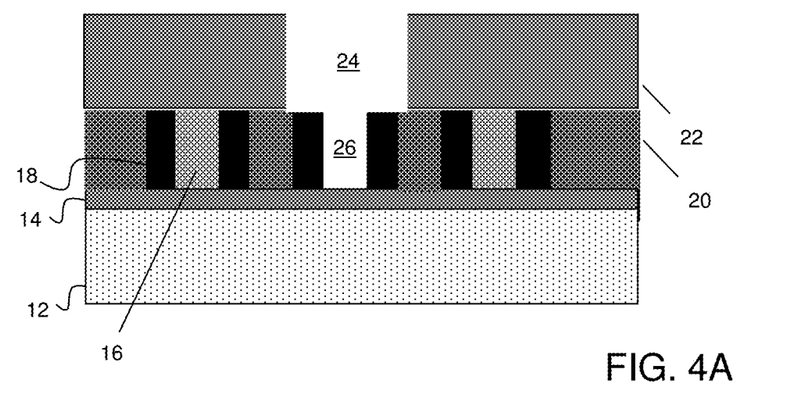
FIG. 4A shows a cut in a mandrel, amongst other features, and respective fabrication processes in accordance with aspects of the disclosure.
Figure 4B:
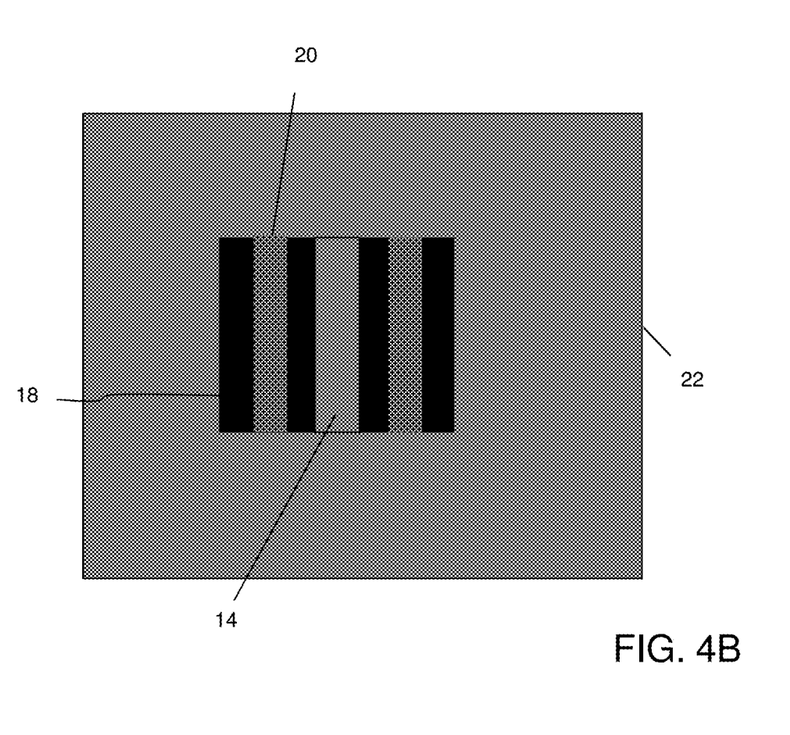
FIG. 4B shows a top view of FIG. 4A.

FIG. 4A shows a cross-sectional view of the structure after mandrel pull processing; whereas, FIG. 4B shows a top view of FIG. 4A. More specifically, in FIGS. 4A and 4B, an exposed portion of the mandrel 16a is removed by a selective etch chemistry. The removal of the exposed portion of the mandrel 16a will result in a trench or cut 26 along a length of the mandrel 16a, exposing the underlying BEOL substrate 14. It should be recognized, though, that remaining portions of the mandrel 16a remain protected under the photolithographic stack of material 22.

Figure 5:
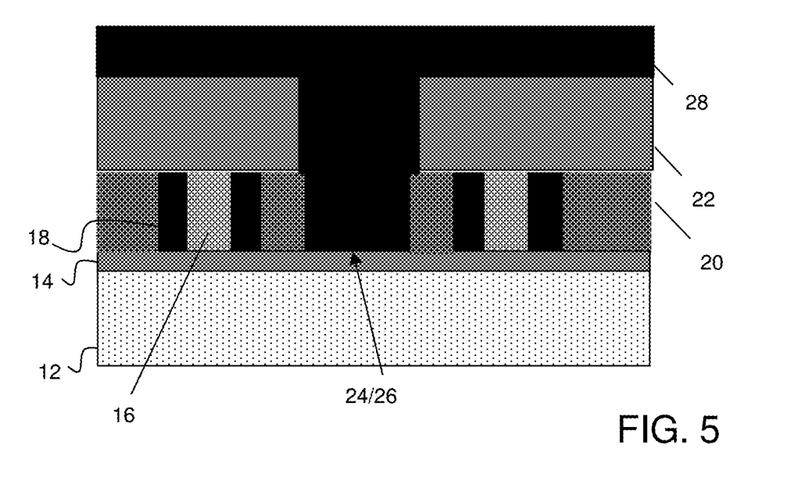
FIG. 5 shows material in a trench (cut) formed by the removal of a portion of the mandrel, amongst other features, and respective fabrication processes in accordance with aspects of the disclosure.

In FIG. 5, a material 28 is deposited within the opening 24 and cut 26 formed by partial removal of the mandrel 16a. In embodiments, the material 28 is the same material as the spacer material 18, e.g., $TiO_x$, which can be a flowable material or deposited by conventional ALD processes. In alternative embodiments, the spacer material 18 and the material 28 can be TiN or other metals that are selective to the mandrel material.

Figure 6:
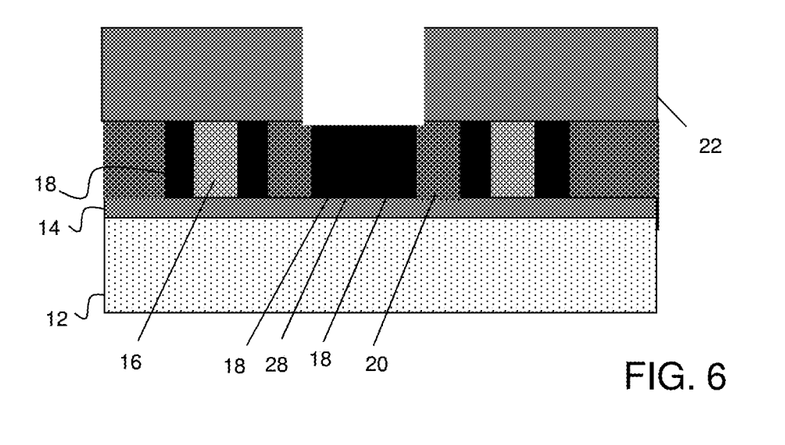
FIG. 6 shows an opening exposing the material and spacer material, amongst other features, and respective fabrication processes in accordance with aspects of the disclosure.

As further shown in FIG. 6, the material 28 can be etched backed to a top surface of the spacer material 18, coating 20 and mandrels 16, 16a. In embodiments, the etch back can be a timed etch to stop on the coating 20 or an end point etch which detects the chemistry difference when the coating 20 begins to etch back. In either scenario, a slight etch back of the coating 20 or spacers 18 will not significantly affect the performance of the end product device.

Figure 7A:
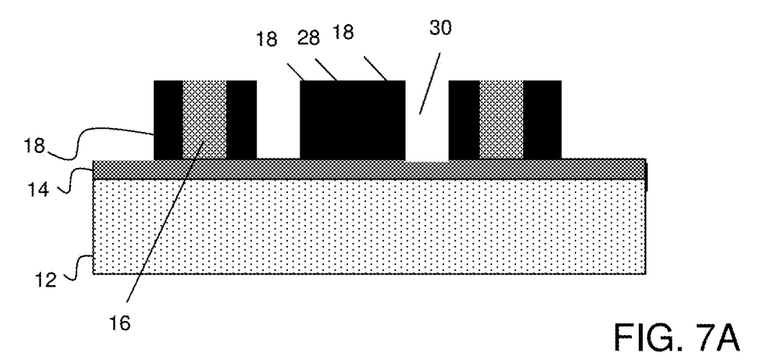
FIGS. 7A and 7B show spaces between mandrels, amongst other features, and respective fabrication processes in accordance with aspects of the disclosure.
Figure 7B:
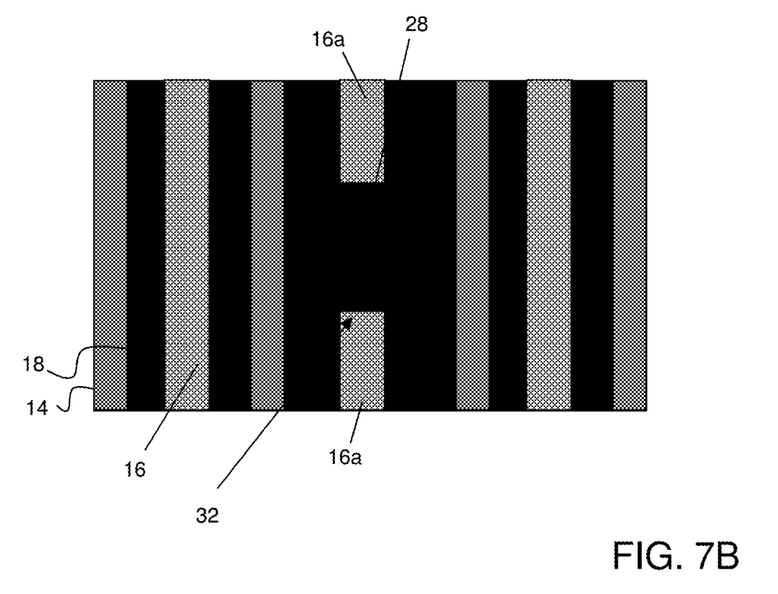

FIG. 7A shows a cross sectional view of the structure after removal of the spin on glass material; whereas, FIG. 7B shows a top view of FIG. 7A. More specifically, as shown in FIGS. 7A and 7B, the photolithographic stack of material 22 can be removed by conventional stripping techniques. Following this removal, the spin on glass material, e.g., material 20, can be removed by a selective chemistry. The resultant structure includes spaces 30 between adjacent spacer material 18 and a cut 32 between adjacent portions of a mandrel 16a, along a length thereof, filled with material 28. In embodiments, the cut 32 can be 2× or more of the thickness of the spacer material 18. In embodiments, the additional material 28 can reduce parasitic capacitance of the structure by about an additional 3%.

Figure 8A:
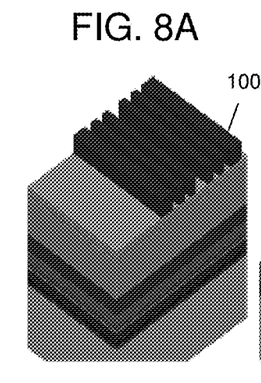
FIGS. 8A-8J show an exemplary, non-limiting example of a two cut variable tip to tip non-mandrel structures and respective fabrication processes that are performed after the variable space mandrel cut for self-aligned double patterning described herein.
Figure 8B:
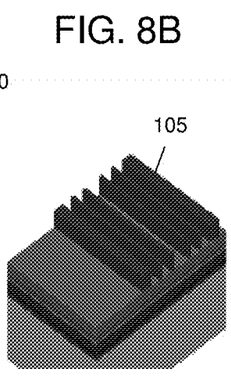
Figure 8C:
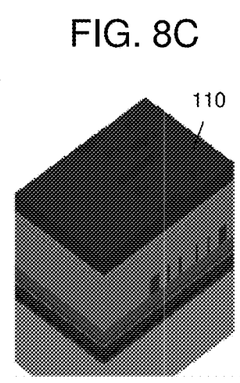
Figure 8D:
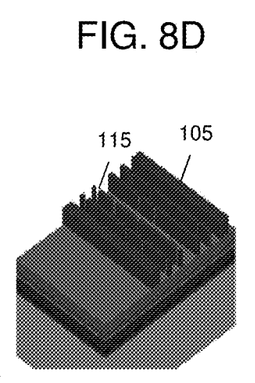
Figure 8E:
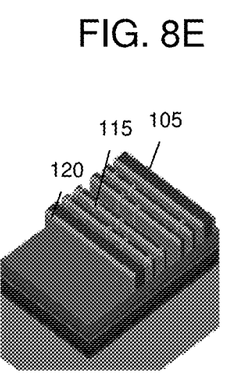
Figure 8F:
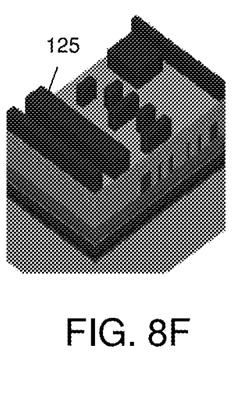
Figure 8G:
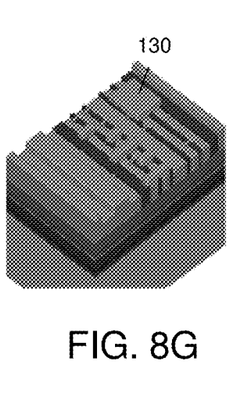
Figure 8H:
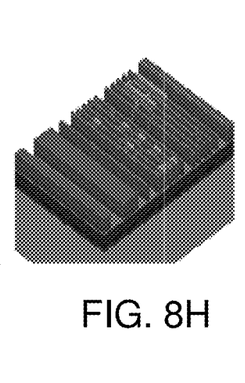
Figure 8I:
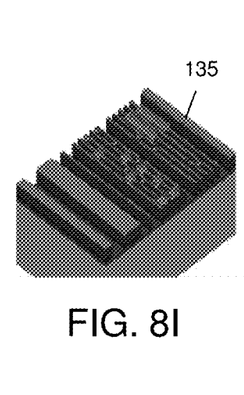
Figure 8J:
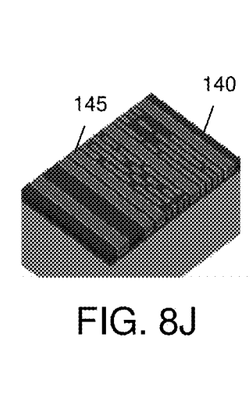

FIGS. 8A-8J show an exemplary, non-limiting example of a two cut variable tip to tip non-mandrel structures and respective fabrication processes that are performed after the variable space mandrel cut for self-aligned double patterning described herein. Specifically, FIG. 8A shows a patterned photoresist 100. FIG. 8B shows a plurality of mandrels 105 formed, and removal of the patterned photoresist 100. The mandrels 105 can be formed by conventional deposition processes, followed by resist removal. In FIG. 8C, a photolithographic mask 110 is formed over the mandrels 105. In FIG. 8D, the mandrels 105 are cut by conventional etching processes. The space (e.g., cut) 115 between the mandrels is less than 2× a spacer width. As further shown in FIG. 8E, a spacer material 120 is deposited between the mandrels 105 and within the spaces 115. A photolithographic mask 125 is formed over the structure (FIG. 8F), followed by a cut spacer 130 formation (FIGS. 8G and 8H). In FIG. 8I, a block photolithographic hardmask 135 is formed by conventional deposition processes, followed by a copper fill 140 and low-k dielectric material 145 (FIG. 8J).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
forming a plurality of mandrels on a substrate;
depositing spacer material on the plurality of mandrels and the substrate between the mandrels;
forming spacers about the plurality of mandrels by etching back the spacer material to expose a surface of the plurality of mandrels and a surface of the substrate between the spacers on the plurality of mandrels;
removing a portion of at least one of the plurality of mandrels to form an opening;
filling the opening with material;
forming a coating on the exposed surface of the plurality of mandrels and the exposed surface of the substrate, between the spacers; and
etching back the coating to expose top surfaces of the plurality of mandrels,
wherein the material filling the opening and the spacers are of a same material.

2. The method of claim 1, wherein the same material is $TiO_x$.

3. The method of claim 1, wherein:
a spacing between the spacers is approximately a dimension equal to a thickness of a mandrel of the plurality of mandrels; and
a thickness of the mandrel of the plurality of mandrels is substantially the same as a thickness of a spacer of the spacers.

4. The method of claim 1, wherein the coating is a spin on glass material.

5. The method of claim 4, wherein the coating is $SiO_2$ or SiOC.

6. The method of claim 1, further comprising:
forming a photolithographic stack of material on the coating;
forming a mask opening in the photolithographic stack of material in alignment with a portion of at least one of the plurality of mandrels; and
removing a portion of the at least one mandrel to form a cut along a length thereof by etching an exposed portion of the at least one mandrel through the mask opening.

7. The method of claim 6, wherein the cut is greater than 2× the width of the spacers.

8. The method of claim 7, wherein the material filling the cut is $TiO_x$ and the spacers are $TiO_x$.

9. A method comprises:
forming a plurality of mandrels on a substrate;
depositing spacer material on the plurality of mandrels and the substrate between the mandrels;
forming spacers on the plurality of mandrels by etching back the spacer material of the spacers which exposes a top surface of the plurality of mandrels and portions of the substrate;
forming a coating on the exposed surface of the substrate and on the spacers;
removing a portion of at least one of the plurality of mandrels to form a cut along a length thereof; and
filling the cut with material,
wherein the cut is formed by applying a photoresist mask on the plurality of mandrels, the coating and the spacers, followed by forming a mask opening in the photoresist mask, and an etching of the portion of the at least one of the plurality of mandrels.

10. The method of claim 9, wherein the material and the spacers are both $TiO_x$.

11. The method of claim 9, wherein the coating is a spin on glass material.

12. The method of claim 9, further comprising removing the coating after filling of the cut.

13. The method of claim 9, wherein the cut is greater than 2× a spacer thickness.

14. The method of claim 13, wherein the plurality of mandrels is a different material than the coating and the spacers.

15. The method of claim 14, wherein remaining of the plurality of mandrels are protected by the photoresist mask when the cut is formed in the portion of the at least one of the plurality of mandrels.

16. A structure, comprising:
a plurality of mandrels;
spacers comprising a spacer material on sidewalls of the plurality of mandrels;
at least one of the plurality of mandrels having a cut along a length thereof;
another spacer material filling the cut along the length thereof; and
a spacing between the spacers is approximately a dimension equal to a thickness of a mandrel of the plurality of mandrels, wherein the thickness of the mandrel of the plurality of mandrels is substantially the same as a thickness of a spacer of the spacers.

* * * * *